(12) United States Patent
Warrick et al.

(10) Patent No.: US 8,187,978 B2
(45) Date of Patent: May 29, 2012

(54) METHOD OF FORMING OPENINGS IN A SEMICONDUCTOR DEVICE AND SEMICONDUCTOR DEVICE

(75) Inventors: Scott Warrick, Austin, TX (US); Massud Abubaker Aminpur, Crolles (FR)

(73) Assignee: Freescale Semiconductor, Inc., Austin, TX (US)

( * ) Notice: Subject to any disclaimer, the term of this patent is extended or adjusted under 35 U.S.C. 154(b) by 270 days.

(21) Appl. No.: 12/669,527

(22) PCT Filed: Jul. 27, 2007

(86) PCT No.: PCT/IB2007/055362
§ 371 (c)(1), (2), (4) Date: Jan. 18, 2010

(87) PCT Pub. No.: WO2009/016438
PCT Pub. Date: Feb. 5, 2009

(65) Prior Publication Data
US 2010/0193919 A1   Aug. 5, 2010

(51) Int. Cl.
*H01L 21/311* (2006.01)
(52) U.S. Cl. ................... 438/702; 257/E21.257
(58) Field of Classification Search ........... 257/E21.023, 257/E21.039, E21.231, E21.232, E21.233, 257/E21.236, E21.24, E21.247, E21.248, 257/E21.257; 438/233, 701, 702, 703, 705
See application file for complete search history.

(56) References Cited

U.S. PATENT DOCUMENTS

| | | | |
|---|---|---|---|
| 5,705,301 A | 1/1998 | Garza et al. | |
| 6,232,222 B1 * | 5/2001 | Armacost et al. | 438/637 |
| 7,115,974 B2 | 10/2006 | Wu et al. | |
| 2001/0037994 A1 | 11/2001 | Ezaki | |
| 2004/0002218 A1 | 1/2004 | Tigelaar | |
| 2005/0170294 A1 | 8/2005 | Kobayashi | |

FOREIGN PATENT DOCUMENTS

| | | | |
|---|---|---|---|
| DE | 102004055248 B3 | 3/2006 | |
| EP | 1818977 A | 8/2007 | |
| JP | 11214280 A | 8/1999 | |
| KR | 20020020507 A | 3/2002 | |
| KR | 20020020507 A | * 3/2002 | |
| WO | 2004/061918 A | 7/2004 | |
| WO | 2005/064671 A1 | 7/2005 | |
| WO | 2005/067021 A1 | 7/2005 | |

OTHER PUBLICATIONS

J. Fung Chen: "RET Mask for The Final Frontier of Optical Lithography" ASML MaskTools, Presentation pp. 1-32, ATR, Oct. 12, 2004.
Steve Hansen: "Contact Hole Solutions" ASML TDC, Tempe, AZ USA, Presentation pp. 1-35, 2004.
International Search Report and Written Opinion correlating to PCT/IB2007/055362 dated Sep. 3, 2008.

* cited by examiner

*Primary Examiner* — William D Coleman
*Assistant Examiner* — Daniel Shook

(57) ABSTRACT

A method of forming openings to a layer of a semiconductor device comprises forming a dielectric layer over the layer of the semiconductor device, forming a main mask over the dielectric layer, the main mask comprising a plurality of main mask openings arranged in a regular pattern extending over the dielectric layer, using a selector mask to select some of the plurality of main mask openings and removing portions of the dielectric layer through the selected some of the plurality of main mask openings to provide openings extending through the dielectric layer to the layer.

20 Claims, 5 Drawing Sheets

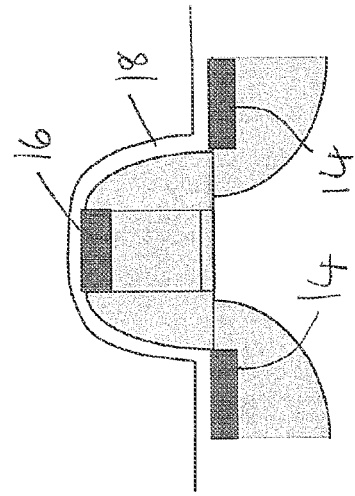
FIG. 1 - PRIOR ART
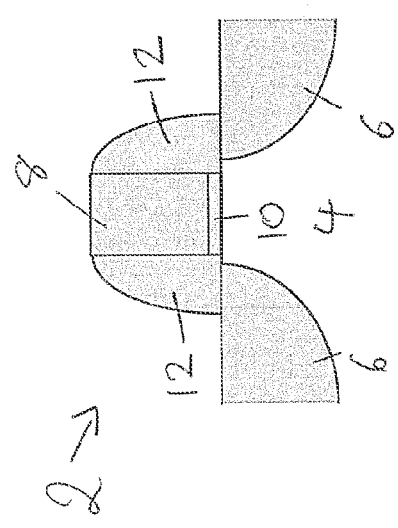
FIG. 2 - PRIOR ART
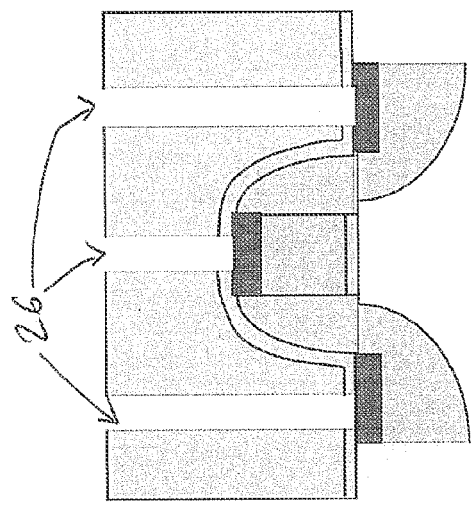
FIG. 3 - PRIOR ART
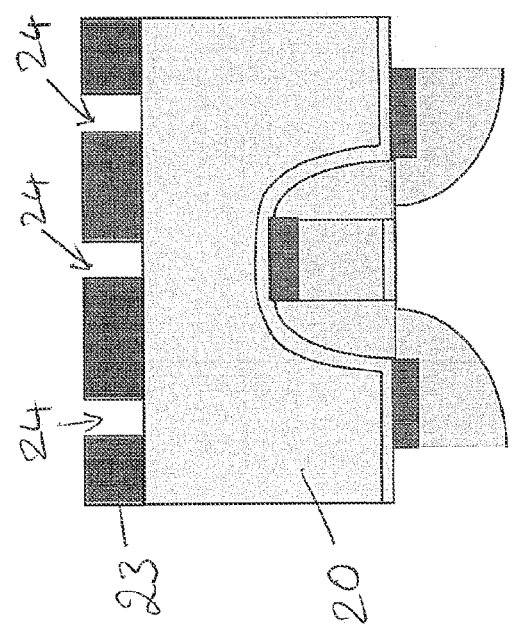
FIG. 4 - PRIOR ART

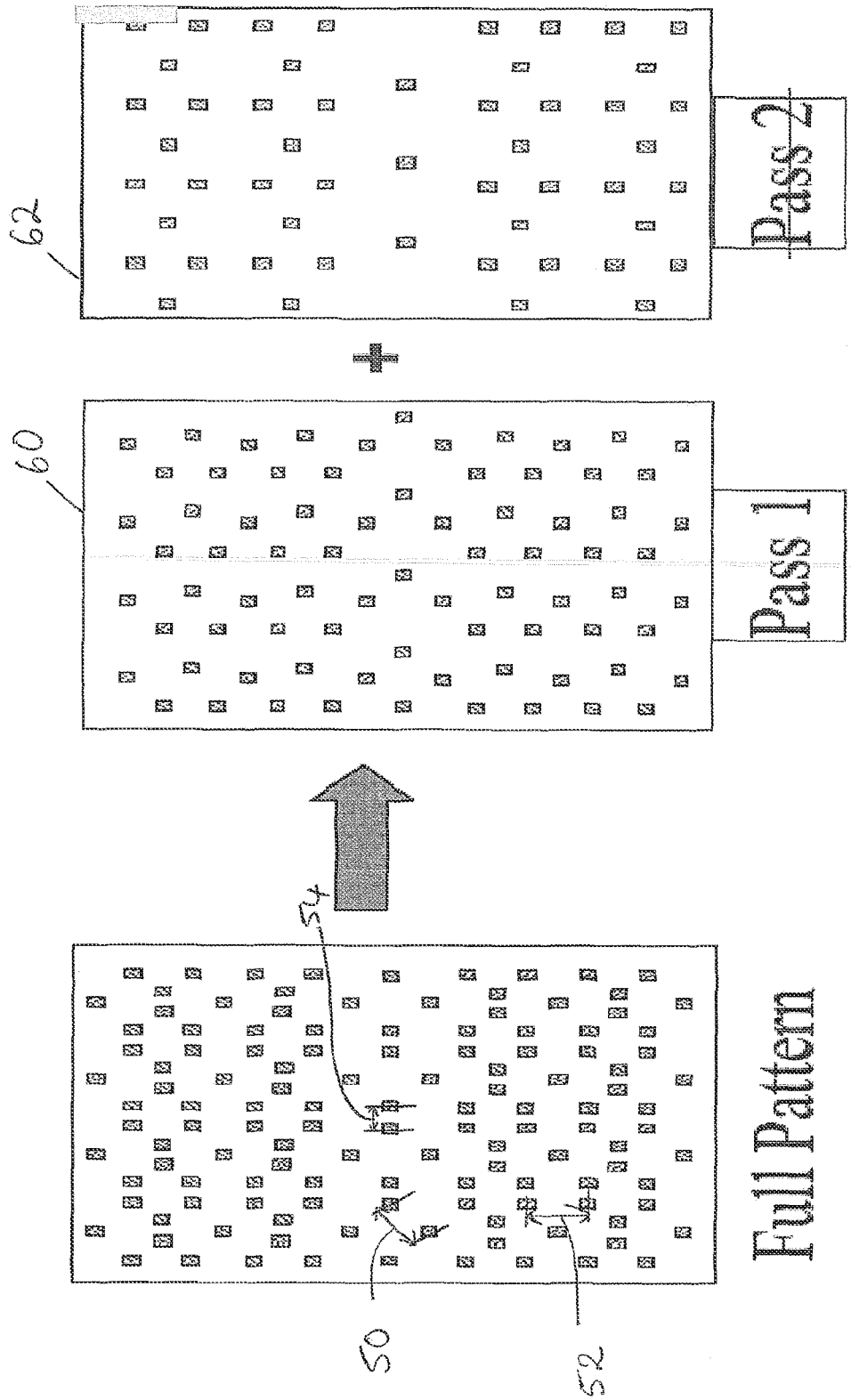
FIG. 6 - PRIOR ART
FIG. 5 - PRIOR ART

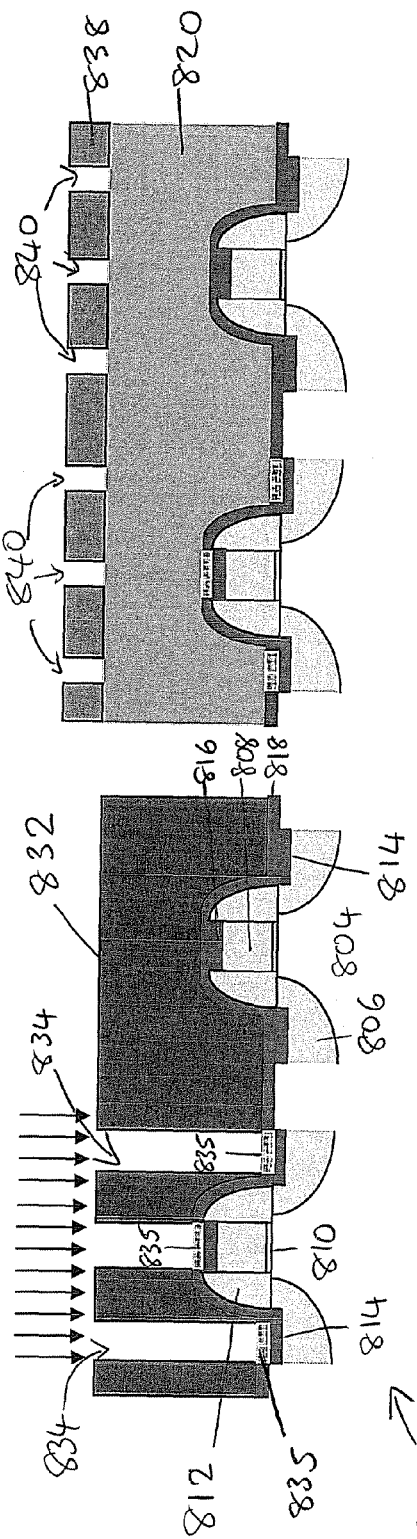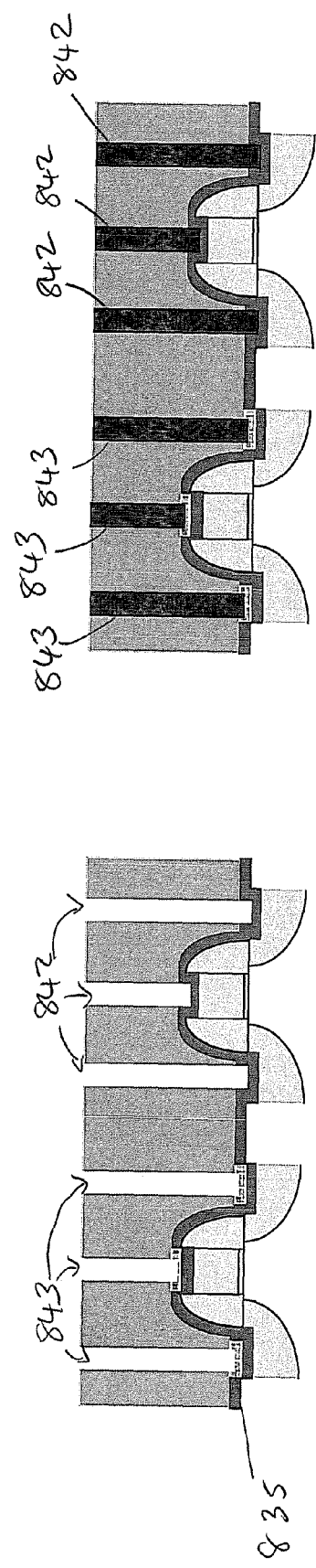
FIG. 11
FIG. 12
FIG. 13
FIG. 14

METHOD OF FORMING OPENINGS IN A SEMICONDUCTOR DEVICE AND SEMICONDUCTOR DEVICE

FIELD OF THE DISCLOSURE

This disclosure relates to a method of forming openings to a layer of a semiconductor device and a semiconductor device.

BACKGROUND

Manufacturing processes for semiconductor devices and Integrated Circuits (ICs) (including semiconductor devices) include a number of lithographic processes to transfer geometric patterns representing the design layout of the different features of a semiconductor device or an IC from reticles or lithographic masks to a light-sensitive chemical (known as photoresist or resist) on a surface of a semiconductor wafer or die to form masks on the semiconductor wafer. The layout patterns on the wafer as defined by the masks are then used in subsequent process steps to manufacture the semiconductor device or IC. In a complex IC (for example, a CMOS IC), the wafer will go through a lithographic process up to 50 times.

Some features, such as contact holes, vias, connection lines, have small dimensions and low manufacturing tolerances in order to avoid device failure; that is, they have small critical dimensions. Such features therefore require the use of critical masks which define the layout patterns for such features on the wafer with small dimensions and to a greater degree of accuracy than a non-critical mask. Critical masks are however more expensive than non-critical masks due to the small dimensions of the reticle, advanced mask technology (i.e. Phase Shift), the control of critical dimensions at the mask level (line width and registration) and the quality of the mask blank. Thus, the use of critical masks therefore adds to the manufacturing costs. It is therefore desirable to minimise the use of critical masks in semiconductor device manufacturing processes.

In optics, the Depth of Focus (DoF) is the distance in front of and beyond the subject that appears to be in focus. In the manufacture of semiconductor devices and ICs, the layout patterns of the features of the semiconductor device including all the smaller features (for 32 nm technology, the smaller features include the contact holes which will be in the range of 50-60 nm after lithography) are transferred to the wafer using lithographic processes. Illumination conditions of the lithographic processes are chosen to balance DoF as well as exposure latitude and the illumination conditions include parameters such as wavelength of light used, size of lens aperture and other parameters of the lithographic equipment.

For features which are to be formed in the same layer of the wafer and which require layout patterns on the lithographic mask which look different or have different densities or pitches (the pitch being the distance between adjacent layout patterns), for a single exposure using a single illumination condition, the process window or Depth of Focus (DoF) for such a lithographic mask is small and is limited by the number of different pitches. For example, the illumination conditions, such as wavelength of light used, and size of lens aperture, for a lithographic mask comprising only a dense regular pattern can be optimised for the dense regular pattern to provide a large process window or DoF and similarly the illumination conditions for a lithographic mask comprising only isolated patterns can be optimised for the isolated patterns to provide a large process window or DoF. However, for a combination of dense regular patterns and isolated patterns on a single lithographic mask for the same layer of the wafer, a compromise in the illumination conditions has to be made which reduces the size of the process window or DoF.

Various techniques are used to reduce the level of defects in the resultant wafer. For instance, prior to the production of the reticle, the semiconductor device or IC layout may be optimised using optical proximity correction (OPC) to create an optimised reticle design layout. Typically, the OPC process involves identification of features that require optimisation. For instance, a rule based approach may be used to find features exhibiting particular properties, e.g. properties that may result in defects when the feature is transferred to the wafer. The distortion of features caused by the subsequent manufacturing process, including optical effects, may be simulated by the OPC process. This could include simulating the optical distortions and diffraction effects occurring when transferring the layout patterns to a wafer. Defects may be identified in the layout patterns should the simulated result fall outside any predetermined tolerances or fail comparison with any other particular criteria. OPC is well known in the art. OPC is described in more detail in U.S. Pat. No. 5,705,301. However, reticles or lithographic masks having a small DoF require more OPC which means that such reticles are more expensive in terms of actual cost at the mask shop and also costs associated with the high computing required to perform the OPC.

Different techniques have been developed to maximise the size of the process window or DoF, in particular for layout patterns in the same layer having different pitches or incompatible densities. For example, one technique uses a double patterning method in which two lithographic masks are used along with two exposures under different illumination conditions and two etch steps. In the example given above, one of the masks is used to transfer the dense regular patterns to the wafer and the other mask is used to transfer the isolated patterns. However, with this method two lithographic masks and two etch steps are required which increases the cost of such a process. Furthermore for features such as contact holes, which require critical masks, the requirement of two critical masks significantly increases the manufacturing costs.

Another technique uses a double exposure method in which one resist layer on the wafer is exposed at two different times with different lithographic masks. This allows for the illumination conditions to be optimised for the different lithographic masks but does not require additional resist layers nor additional etch steps. However, as with the double patterning method, the double exposure method requires two masks which increases the manufacturing costs and multiple passes in order to produced the layout pattern on the wafer which reduces through put. In addition, the combination of the two exposures cannot improve the minimum resolution limit which results in over sized contact holes.

There is therefore a need for an improved method of forming openings, such as contact holes, in semiconductor devices.

SUMMARY

The present invention provides a method of forming openings to a layer of a semiconductor device and a semiconductor device as described in the accompanying claims.

BRIEF DESCRIPTION OF THE DRAWINGS

A method of forming openings to a layer of a semiconductor device and a semiconductor device in accordance with the present disclosure will now be described, by way of example only, with reference to the accompanying drawings in which:

FIGS. 1-4 are simplified schematic cross-section diagrams of a portion of a semiconductor transistor device during different stages of fabrication;

FIG. 5 is a top plan view of a layout pattern of contact holes for a semiconductor transistor device;

FIG. 6 is a top plan view of two lithographic masks which may be used to form the layout pattern of contact holes shown in FIG. 5;

FIGS. 11-14 are simplified schematic cross-section diagrams of a portion of a semiconductor device during different stages of fabrication in accordance with a second embodiment of the disclosure.

DETAILED DESCRIPTION OF THE PREFERRED EMBODIMENTS

Figure 8:
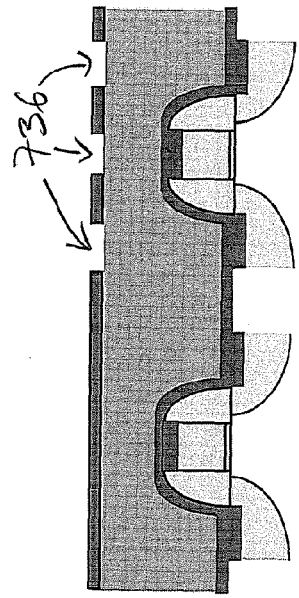
FIGS. 7-10 are simplified schematic cross-section diagrams of a portion of a semiconductor device during different stages of fabrication in accordance with a first embodiment of the disclosure.

In the description that follows and in FIGS. 1-4, and 7-14 certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

The present disclosure will be described with reference to a semiconductor device comprising a transistor device such as a N-channel vertical MOSFET device. It will be appreciated that the disclosure is not limited to vertical devices nor N-channel MOSFET devices and applies equally to other semiconductor devices, such as lateral devices, P-channel vertical MOSFET devices or insulated gate bipolar transistor (IGBT) devices, or JFETs or diodes or similar devices or logic devices or complex ICs comprising a number of different semiconductor devices.

A MOSFET device typically comprises a plurality of transistor base cells which form the active area of the device surrounded by a termination area which extends from the active area to the edge of the device (i.e. the edge of the die). The active area typically uses minimum size features to minimise size or maximise density.

FIGS. 1-4 shows a typical method of forming openings or contact holes for the contacts of a transistor base cell 2 which forms an active area of a semiconductor transistor device. In order to simplify the description, not all the features of a transistor base cell are shown.

The active area of the transistor base cell 2 includes p-type well or body regions 6 extending into a layer 4 which may be a n-type semiconductor substrate or a n-type epitaxial layer and a channel region (not shown) in the layer 4, which channel region is controlled by a gate region 8 formed over an oxide layer 10. The gate region 8 typically comprises a doped polycrystalline semiconductor material such as polysilicon or metal gate materials such as titanium nitride TiN or tantalum carbide TaC. Spacers 12 are formed to isolate the gate region 8 from subsequently formed metal contacts. Salicided regions 14 are formed in the body regions 6 and form contact regions of the device. The salicided regions 14 may be formed from titanium disilicide $TiSi_2$. A silicide cap 16 is formed on the gate region 8.

An etch stop layer 18 is then formed over the layer 4, the spacers 12 and cap 16 (see FIG. 2). In FIG. 3, a pre-metal dielectric oxide layer 20, such as boron-doped glass PSG, is formed over the etch stop layer 18 and a critical mask 22 for defining the contact openings 24 is formed over the pre-metal dielectric oxide layer 20 using standard lithographic techniques. For example, the critical mask comprises a layer of resist material and an Anti-Reflective Coating (ARC). The ARC may be formed beneath the resist layer and in this configuration is known as bottom-ARC (or BARC) or on top of the resist layer and in this configuration is known as top-ARC or TARC. The critical mask is patterned by means of exposing the critical mask 22 to light, such as UV light, through a reticle or lithographic mask (not shown) and then the critical mask 22 is developed to provide the critical mask 22 with contact openings 24.

Openings or contact holes 26 are then formed in the pre-metal dielectric oxide layer 20 by etching the pre-metal dielectric oxide layer 20 through the contact openings 24 in the critical mask 22 and the critical mask 22 is then removed as shown in FIG. 4.

FIG. 5 shows a typical layout pattern for the contacts of a transistor device. The pitch is the sum of the line width and space width for repeating patterns of lines and spaces and as can be seen by the pitches 50, 52 and 54 shown in FIG. 5 can vary significantly from an optical view point. As discussed in the introduction above, due to the variations in pitches, in order to transfer the layout pattern of FIG. 5 to a wafer using a single exposure, a compromise is required when selecting the illumination conditions e.g. wavelength of light, lens aperture. This results in reduced cost since a single mask is used but also results in a small process window or DoF. If the double exposure technique is used in order to improve the DoF, the design is split into two reticles 60, 62 with two exposures to achieve the pattern shown in FIG. 5 and with pitches that are more relaxed in part than that of the more dense pitch of the single reticle: one reticle 60 includes a first pitch pattern and the illumination conditions are optimised for the first pitch pattern and one reticle 62 includes a second pitch pattern and the illumination conditions are optimised for the second pitch pattern. However, this double exposure method requires two critical masks to form the contacts of the transistor which increases significantly the manufacturing costs.

Briefly, a method of forming openings to a layer of a semiconductor device in accordance with the disclosure comprises forming a dielectric layer over the layer of the semiconductor device, forming a main mask over the dielectric layer, the main mask comprising a plurality of main mask openings arranged in a pattern extending over the dielectric layer, using a selector mask to select some of the plurality of main mask openings, and removing portions of the dielectric layer through the selected some of the plurality of main mask openings to provide openings extending through the dielectric layer to the layer.

Thus, it will be appreciated that the method in accordance with the disclosure uses one main mask to define a pattern of openings and a selector mask to select some of the openings of the pattern of openings such that the dielectric layer is etched through the selected openings to the layer. Thus, when a design layout requires features with small critical dimensions, the method in accordance with the disclosure uses one critical mask (the main mask) and avoids the need for multiple critical masks.

Figure 15:
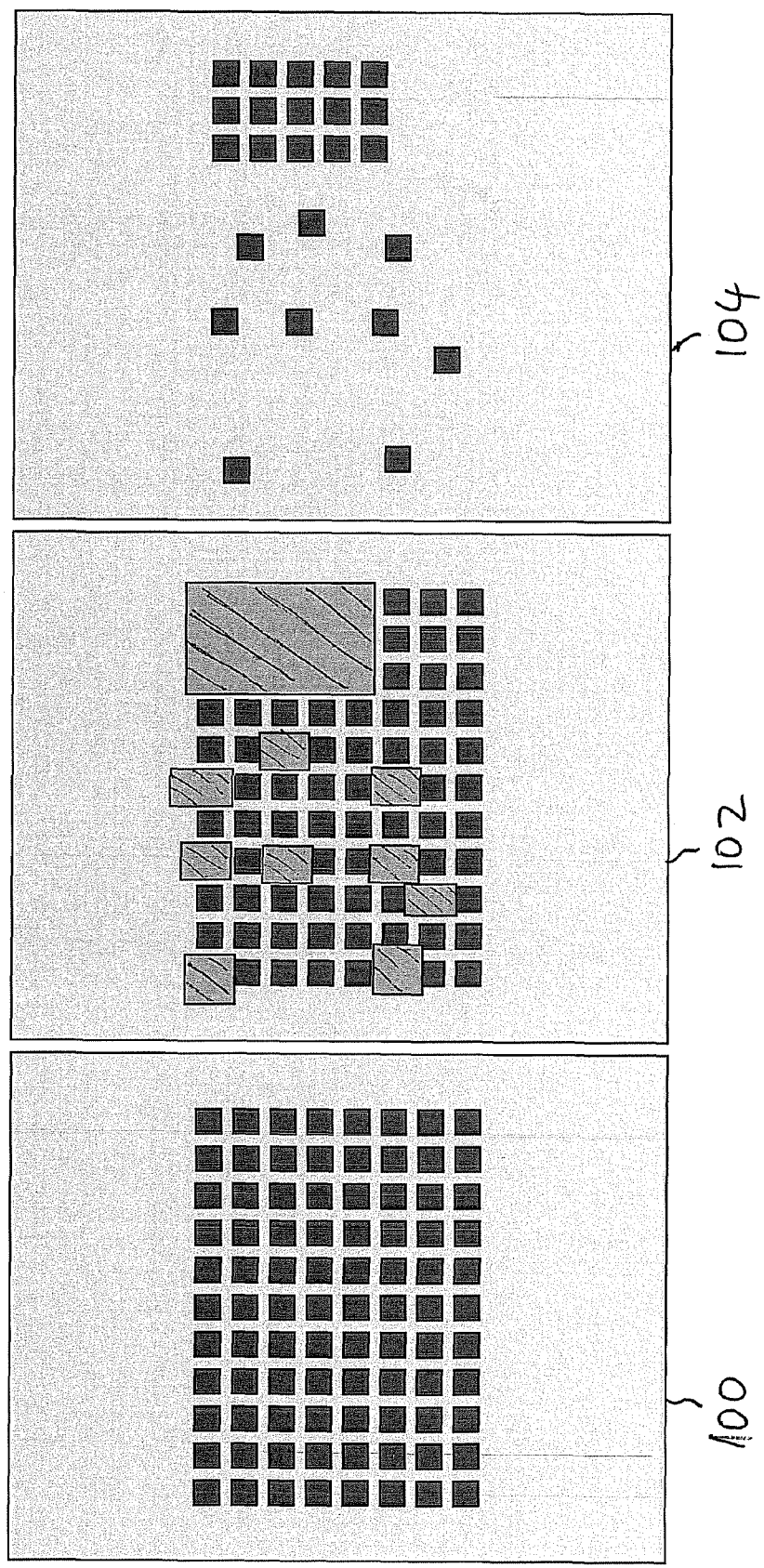
FIG. 15 is a top plan view of layout patterns for a main mask and a selector mask and the resulting combination as used in the method in accordance with the disclosure.

In an embodiment, the main mask comprises a regular or periodic pattern or a dense regular pattern. For a dense regular pattern, the pitch of the main mask pattern is small. An example of a main mask having a dense regular pattern is shown in FIG. 15: the main mask or in this case a critical mask is designated by the reference numeral 100. By having a regular pattern, dense or otherwise, the illumination conditions used in the lithographic techniques to form the main mask are selected so as to be optimum for the regular pattern ensuring an optimum process window and DoF.

FIG. 15 also shows in block 102 the pattern (blocks with cross-hatching) of the selector mask overlying the regular pattern of the critical mask 100. The pattern resulting from the combination of the critical mask and the selector mask in accordance with the disclosure is shown in block 104. The resulting pattern defines the location of the openings which extend to the layer. Thus, the selector mask selects those openings defined by the critical mask which are required to extend to the layer.

The resulting pattern of openings can be changed rapidly and easily by changing the selector mask so as to select different openings of the pattern of openings defined by the main or critical mask. This can be achieved through the ROM coding which defines the selector mask.

The openings formed by the method in accordance with the disclosure may be any openings that extend between two layers of a semiconductor device. For example, the openings may include contact holes, trenches, vias, lines or any similar opening. The method provides particular advantages for openings having small or low tolerance dimensions in order to optimise the DoF of the lithographic processes used to form the openings whilst not significantly increasing the cost e.g. by having multiple masks.

In an embodiment, the selector mask comprises a plurality of selector mask openings, the dimensions of the selector mask openings being greater than the dimensions of the main mask openings (i.e. the pitch is larger for the selector mask compared to the main mask). For example, the pitch of the main mask pattern may be 100 nm pitch and the pitch of the selector mask pattern may be larger by a factor of between 2 to 3.

A method of forming openings in a semiconductor device in accordance with a first embodiment of the disclosure will now be described with reference to FIGS. 7-10. Although described with reference to a MOSFET transistor device comprising a plurality of transistor base cells which form the active area of the device and with respect to contact holes, it will be appreciated that the method in accordance with the first embodiment may apply to other semiconductor devices and openings as discussed above. Like components to those of FIGS. 1-4 are referenced by the same reference numeral plus the number 700. In FIGS. 7-10, not all of the elements of a transistor base cell are shown in order to simplify the description of the disclosure. For example, the drain and source regions are not shown in the FIGs.

Figure 7:
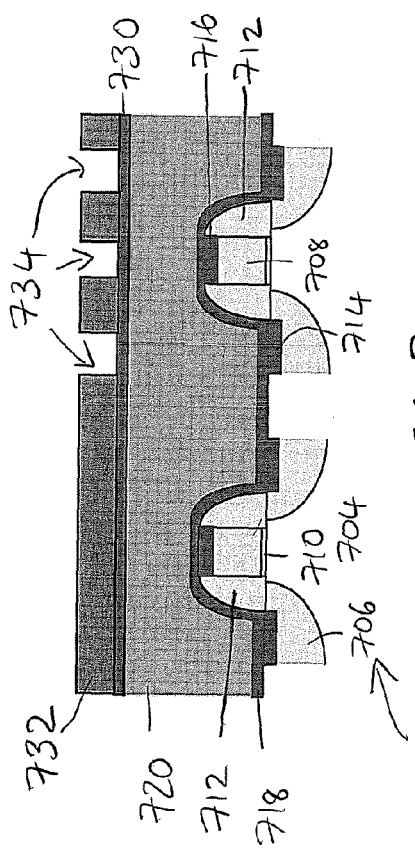

In FIG. 7, active areas of a transistor base cell 702 includes p-type well or body regions 706 extending into a layer 704 which may be a n-type semiconductor substrate or a n-type epitaxial layer and a channel region (not shown) formed in the layer 704 and controlled by a gate region 708 formed over an oxide layer 710. The gate region 708 typically comprises a doped polycrystalline semiconductor material such as polysilicon or metal gate materials such as titanium nitride TiN or tantalum carbide TaC. Spacers 712 are formed to isolate the gate region 708 from subsequently formed metal contacts. Salicided regions 714 are formed in the body regions 706 and form the contact regions of the device. The salicided regions 714 may be formed from nickel silicide NiSi. A cap 716 is formed on the gate region 708. A barrier layer or etch stop layer 718, for example a silicon nitride layer, is then formed over the layer 704, the spacers 712 and cap 716. A dielectric layer 720, which is typically a Pre-Metal Dielectric (PMD) oxide layer such as boron-doped glass PSG, is formed over the etch stop layer 718.

A sacrificial layer 730 is formed over the dielectric layer 720. The sacrificial layer may be a silicon nitride layer or a metal hard mask such as titanium nitride TiN. A selector mask 732 is formed over the sacrificial layer 730 and comprises a plurality of selector mask openings 734 for defining portions of the dielectric layer 720 in which openings extending through the dielectric layer 720 to a layer such as some of the salicided regions 714 in the layer 704 and to some of the gate regions 708 can be formed. The selector mask 732 is not a critical mask and is formed using standard lithographic techniques for forming a non-critical mask which are well known in the art. For example, the selector mask may be formed from a resist layer which is patterned by means of exposing the resist layer to light, such as UV light, through a reticle or lithographic mask (not shown) and then resist layer is developed to provide the selector mask 732 with selector mask openings 734.

In FIG. 8, portions of the sacrificial layer 730 through the selector mask openings 734 are removed by etching to provide sacrificial openings 736 extending through the sacrificial layer 730 to the dielectric layer 720. The sacrificial openings 736 define the portions of the dielectric layer 720 in which openings extending through the dielectric layer 720 to portions of the layer 704 and the gate region 708 can be formed. The selector mask 732 is then removed.

Figure 9:
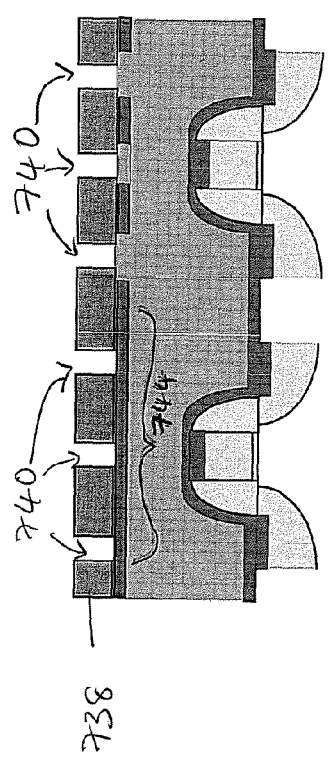

A main or critical mask 738 is formed over the sacrificial layer 730 and includes a plurality of main or critical mask openings 740 arranged in a pattern which pattern extends over the dielectric layer 720 and the sacrificial openings 736 (see FIG. 9). The sacrificial openings 736 are arranged to correspond to some of the plurality of critical mask openings 740 so as to select the some of the plurality of critical mask openings for subsequent processing of the dielectric layer 720. The critical mask 738 is formed using standard lithographic techniques for forming a critical mask which are well known in the art. For example, the critical mask may be formed from a resist layer and a ARC layer. The ARC layer may be formed beneath the resist layer and in this configuration is known as bottom-ARC (or BARC) or on top of the resist layer and in this configuration is known as top-ARC or TARC. The resist/ARC layer is patterned by means of exposing the resist/ARC layer to light, such as UV light, through a reticle or lithographic mask (not shown) and then the resist/ARC layer is developed to provide the critical mask 738 with critical mask openings 740. As is will known, differences between forming a critical mask and a non-critical mask include the illumination conditions, choice of resist material, DoF and exposure latitude.

Figure 10:
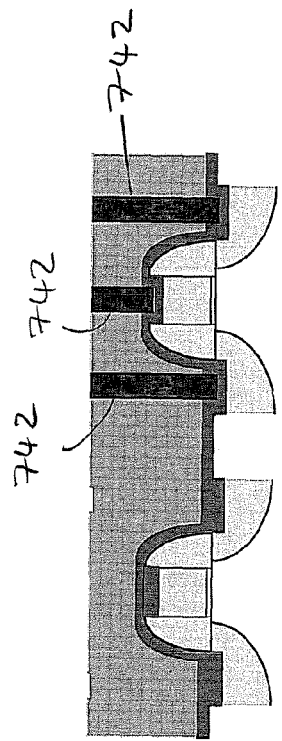

Portions of the dielectric layer 720 are then removed by etching the dielectric layer 720 through the critical mask openings 740 and the sacrificial openings 736 to provide openings 742 extending through the dielectric layer 720 and the etch stop layer 718 to portions of the layer 704 such as the salicided regions 714 and the gate region 708 as shown in FIG. 10. The etching process typical includes fluorine containing gases in a capacitively or inductively coupled etch chamber to etch the dielectric layer 720 to the etch stop layer 718. The etch stop layer 718 is then removed and a further etch process extends the openings to the active areas 702 or gate region 708.

The etch process is arranged such that the sacrificial layer 730 is removed at a rate that is significantly less (5 to 10 times less) than the rate of removal of the dielectric layer 720 which means that little if any of the dielectric layer 720 is etched under the critical mask openings 740 which do not correspond to sacrificial openings 736 and so extend over the sacrificial layer 730 (designated by reference numeral 744 in FIG. 9).

The critical mask 738 and sacrificial layer 730 are then removed, and metal contacts are formed in the openings 742. The metal contacts are typically formed by depositing a barrier layer (not shown), such as a titanium nitride layer, in the openings 742 and then filling the openings 742 with a metal, such as tungsten. The barrier layer provides a barrier between the metal and dielectric layer 720.

A method of forming openings in a semiconductor device in accordance with a second embodiment of the disclosure will now be described with reference to FIGS. 11-14. Although described with reference to a MOSFET transistor device comprising a plurality of transistor base cells which form the active area of the device and with respect to contact holes, it will be appreciated that the method in accordance with the second embodiment may apply to other semiconductor devices and openings as discussed above. Like components to those of FIGS. 1-4 are referenced by the same reference numeral plus the number 800. In FIGS. 11-14, not all of the elements of a transistor base cell are shown in order to simplify the description of the disclosure. For example, the drain and source regions are not shown in the FIGs.

In FIG. 11, active areas of a transistor base cell 802 includes p-type well or body regions 806 extending into a layer 804 which may be a n-type semiconductor substrate or a n-type epitaxial layer and a channel region (not shown) formed in the layer 804 and controlled by a gate region 808 formed over an oxide layer 810. The gate region 808 typically comprises a doped polycrystalline semiconductor material such as polysilicon or metal gate materials such as titanium nitride TiN or tantalum carbide TaC. Spacers 812 are formed to isolate the gate region 808 from subsequently formed metal contacts. Salicided regions 814 are formed in the body regions 806 and from the contact regions of the device. The salicided regions 14 may be formed from nickel silicide NiSi. A cap 816 is formed on the insulated gate region 808. A barrier layer or etch stop layer 818, for example a silicon nitride layer, is then formed over the layer 804, the spacers 812 and cap 816.

A selector mask 832 is formed over the barrier layer or etch stop layer 818 and comprises a plurality of selector mask openings 834 for defining portions of a dielectric layer 820 to be formed over the layer 804 in which openings extending through portions of the dielectric layer 820 to a layer such as some of the salicided regions 814 in the layer 804 and some of the gate regions 808 cannot be formed. The selector mask 832 is not a critical mask and is formed using standard lithographic techniques for forming a non-critical mask which are well known in the art. For example, the selector mask may be formed from a resist layer which is patterned by means of exposing the resist layer to light, such as UV light, through a reticle or lithographic mask (not shown) and then resist layer is developed to provide the selector mask 832 with selector mask openings 834.

An element is then provided through the plurality of selector mask openings 834 to modify portions 835 of the etch stop layer 818. The element is selected to control the removal rate of the modified portions 835 of the etch stop layer 818. The element may include carbon, nitrogen, helium, argon or any element that can be implanted without affecting the electrical characteristics of the semiconductor device and the element is implanted into the etch stop layer 818 through the plurality of selector mask openings 834. In the embodiment shown in FIGS. 11-14, the element is chosen to make the modified portions 835 of the etch stop layer 818 more resistant to etch. The selector mask 832 is then removed.

A dielectric layer 820, which is typically a Pre-Metal Dielectric (PMD) oxide layer such as boron-doped glass PSG, is formed over the etch stop layer 818 including the modified portions 835 and unmodified portions.

A main or critical mask 838 is formed over the dielectric layer 820 and includes a plurality of main or critical mask openings 840 arranged in a pattern which pattern extends over the dielectric layer 820 (see FIG. 12). The selector mask openings 834 and are arranged so that the unmodified portions of the etch stop layer 818 correspond to some of the plurality of critical mask openings 840 so as to select the some of the plurality of critical mask openings for subsequent processing of the dielectric layer 820 to form the openings extending to the layer 804 and the gate region 808 of the device. The critical mask 838 is formed using standard lithographic techniques for forming a critical mask which are well known in the art. For example, the critical mask may be formed from a resist layer including a dielectric layer such as a silicon nitride layer and a ARC layer. The ARC may be formed beneath the resist layer and in this configuration is known as bottom-ARC (or BARC) or on top of the resist layer and in this configuration is known as top-ARC or TARC. The resist/ARC layer is patterned by means of exposing the resist/ARC layer to light, such as UV light, through a reticle or lithographic mask (not shown) and then the resist/ARC layer is developed to provide the critical mask 838 with critical mask openings 840.

Portions of the dielectric layer 820 are then removed by etching the dielectric layer 820 through the critical mask openings 840 to provide openings 842, 843 extending through the dielectric layer 820 to the etch stop layer 818. For the openings 842 extending to unmodified portions of the etch stop layer 818, the unmodified portions of the etch stop layer are removed so that the openings 842 extend though the dielectric layer 820 and the etch stop layer 818 to a layer such as some of the salicided regions 814 of the layer 804 and some of the gate regions 808 as shown in FIG. 13. For the openings 843 extending to the modified portions 835 of the etch stop layer 818, the modified portions 835 of the etch stop layer are not removed since the modified portions 835 are more resistant to etch so that the openings 843 extend though the dielectric layer 820 only as far as the etch stop layer 818 and not to the layer 804 nor the gate region 808.

The etching process typical includes fluorine containing gases in a capacitively or inductively coupled etch chamber. The etch process is arranged such that the modified portions 835 of the etch stop layer 818 is removed at a rate that is significantly less than the rate of removal of the unmodified portions of the etch stop layer 818.

The critical mask 838 is then removed, and metal contacts are formed in the openings 842, 843. The metal contacts are typically formed by depositing a barrier layer (not shown), such as a titanium nitride layer, in the openings 842, 843 and then filling the openings 842, 843 with a metal, such as tungsten. The barrier layer provides a barrier between the metal and dielectric layer 820.

Thus, as can be seen in FIG. 14, metal contacts are provided to the salicided regions 814 and gate region 808 of the semiconductor transistor device by means of the openings 842 but although the openings 843 are filled with metal due to the openings 843 only extending as far as the modified portions 835 of the etch stop layer 818, no contact is made by the metal in openings 843 to the active areas of the semiconductor transistor device.

In an alternative embodiment to the second embodiment described above with reference to FIGS. 11-14, a selector mask (not shown) may be formed over the barrier layer or etch stop layer 818 of FIG. 11 and comprises a plurality of selector mask openings for defining portions of a dielectric layer to be formed over the layer in which openings extending through the dielectric layer to the layer can be formed. In this alternative embodiment, an element is then provided through the plurality of selector mask openings to modify portions of the etch stop layer to make the modified portions of the etch stop layer less resistance to etch. The element may include carbon, nitrogen, helium, argon or any element that can be implanted without affecting the electrical characteristics of the semiconductor device, which element is implanted into the etch stop layer through the plurality of selector mask openings.

In this embodiment, the selector mask openings are arranged so that the modified portions of the etch stop layer 818 correspond to some of the plurality of critical mask openings 840 so as to select the some of the plurality of critical mask openings for subsequent processing of the dielectric layer to form the openings extending to a layer of the device.

Portions of the dielectric layer are then removed by etching the dielectric layer through the critical mask openings to provide openings extending through the dielectric layer to the etch stop layer. For the openings extending to modified portions of the etch stop layer, the modified portions of the etch stop layer are removed as they are less resistance to etch compared to the unmodified portions so that the openings extend though the dielectric layer and the etch stop layer to a layer such as some of the salicided regions of a layer or some of the gate regions of the semiconductor device. For the openings extending to the unmodified portions of the etch stop layer, the unmodified portions of the etch stop layer are not removed since the unmodified portions are more resistant to etch so that the openings extend though the dielectric layer only as far as the etch stop layer and not to the active areas.

In summary, the method in accordance with the disclosure uses a main mask having a plurality of openings arranged in a regular pattern and a selector mask to select some of the plurality of openings so that openings to a layer of a semiconductor device are formed for only the selected some of the plurality of openings. For designs requiring small dimensions, the method does not require the use of multiple critical masks (the main mask being the critical mask in this case) so that the manufacturing costs are minimised and since it does not require double exposure steps nor double etch steps, no additional passes are required so that through put can be improved compared to the known techniques requiring double exposure and double etch techniques.

It will be appreciated that in the future as the dimensions of device features decrease so that pitch size becomes smaller, the method in accordance with the disclosure can still be used in the lithographic processes for manufacturing such devices since it can optimise DoF for small pitch features.

In the foregoing specification, the invention has been described with reference to specific examples of embodiments of the invention. It will, however, be evident that various modifications and changes may be made therein without departing from the broader scope of the invention as set forth in the appended claims.

The invention claimed is:

1. A method of forming openings to a layer of a semiconductor device comprising:
   forming a barrier layer over the layer of the semiconductor device;
   forming a selector mask over the barrier layer, the selector mask comprising a plurality of selector mask openings;
   providing an element through the plurality of selector mask openings to modify portions of the barrier layer so that the barrier layer includes modified portions and unmodified portions;
   removing the selector mask;
   forming a dielectric layer over the barrier layer;
   forming a main mask on the dielectric layer, the main mask comprising a plurality of main mask openings arranged in a regular pattern extending over the dielectric layer, wherein the unmodified portions of the barrier layer are arranged to correspond to some of the plurality of main mask openings so as to select the some of the plurality of main mask openings;
   removing portions of the dielectric layer through the selected some of the plurality of main mask openings to the unmodified portions of the barrier layer; and
   removing the unmodified portions of the barrier layer to provide openings extending through the dielectric layer and the barrier layer to the layer.

2. A method of forming openings to a layer of a semiconductor device comprising:
   forming a barrier layer over the layer of the semiconductor device;
   forming a selector mask over the barrier layer, the selector mask comprising a plurality of selector mask openings;
   providing an element through the plurality of selector mask openings to modify portions of the barrier layer so that the barrier layer includes modified portions and unmodified portions;
   removing the selector mask;
   forming a dielectric layer over the barrier layer;
   forming a main mask on the dielectric layer, the main mask comprising a plurality of main mask openings arranged in a regular pattern extending over the dielectric layer, wherein the modified portions of the barrier layer are arranged to correspond to some of the plurality of main mask openings so as to select the some of the plurality of main mask openings;
   removing portions of the dielectric layer through the selected some of the plurality of main mask openings to the modified portions of the barrier layer; and
   removing the modified portions of the barrier layer to provide openings extending through the dielectric layer and the barrier layer to the layer.

3. A method as claimed in claim 1, wherein the plurality of main mask openings are arranged in a dense regular pattern.

4. A method as claimed in claim 1, further comprising forming an additional layer over the dielectric layer and wherein the openings are arranged to extend between the layer and the additional layer.

5. A method as claimed in claim 1, wherein the openings are at least one of contact holes, vias, lines and trenches.

6. A method as claimed in claim 1, wherein the element is selected to control the removal rate of the modified portions of the barrier layer.

7. A method as claimed in claim 1, wherein the step of providing an element comprises implanting at least one of the following elements into the barrier layer: carbon, nitrogen, helium, argon.

8. A method as claimed in claim 1, wherein the selector mask comprises a plurality of selector mask openings, the dimensions of the selector mask openings being greater than the dimensions of the main mask openings.

9. A method as claimed in claim 1, further comprising changing the selector mask so as to select different main mask openings of the plurality of main mask openings.

10. A semiconductor device having a layer, a dielectric layer formed over the layer and openings to the layer formed by the method according to claim 1.

11. A method as claimed in claim 3, further comprising forming an additional layer over the dielectric layer and wherein the openings are arranged to extend between the layer and the additional layer.

12. A method as claimed in claim 3, wherein the openings are at least one of contact holes, vias, lines and trenches.

13. A semiconductor device according to claim 10, wherein the openings include at least one of the following; contact holes, vias, trenches and lines.

14. A method as claimed in claim 2, wherein the plurality of main mask openings are arranged in a dense regular pattern.

15. A method as claimed in claim 2, further comprising forming an additional layer over the dielectric layer and wherein the openings are arranged to extend between the layer and the additional layer.

16. A method as claimed in claim 2, wherein the openings are at least one of contact holes, vias, lines and trenches.

17. A method as claimed in claim 2, wherein the element is selected to control the removal rate of the modified portions of the barrier layer.

18. A method as claimed in claim 2, wherein the step of providing an element comprises implanting at least one of the following elements into the barrier layer: carbon, nitrogen, helium, argon.

19. A method as claimed in claim 2, wherein the selector mask comprises a plurality of selector mask openings, the dimensions of the selector mask openings being greater than the dimensions of the main mask openings.

20. A method as claimed in claim 2, further comprising changing the selector mask so as to select different main mask openings of the plurality of main mask openings.

* * * * *